United States Patent [19]

Smith et al.

[11] Patent Number: 4,654,604
[45] Date of Patent: Mar. 31, 1987

[54] FREQUENCY CONTROLLED OSCILLATOR UTILIZING AN U/D COUNTER IN THE FEEDBACK

[75] Inventors: Robert Smith, Meyrin; Anthony Newton, Le Vaud, both of Switzerland

[73] Assignee: Motorola, Inc., Schaumburg, Ill.

[21] Appl. No.: 845,274

[22] PCT Filed: Jun. 6, 1985

[86] PCT No.: PCT/GB85/00244
§ 371 Date: Feb. 6, 1986
§ 102(e) Date: Feb. 6, 1986

[87] PCT Pub. No.: WO85/05744
PCT Pub. Date: Dec. 19, 1985

[30] Foreign Application Priority Data

Jun. 6, 1984 [GB] United Kingdom ............... 8414449

[51] Int. Cl.[4] .................. H03L 7/18; H03L 7/22; H04N 5/12
[52] U.S. Cl. ............................. 331/1 A; 331/2; 331/10; 331/17; 331/20; 331/25; 358/158
[58] Field of Search ............... 331/1 A, 2, 10, 17, 331/20, 14, 25; 358/158, 159

[56] References Cited

U.S. PATENT DOCUMENTS

| | | | |
|---|---|---|---|
| 3,651,422 | 3/1972 | Underhill | 331/1 A |
| 4,105,946 | 8/1978 | Ikeda | 331/1 A |
| 4,122,488 | 10/1978 | Mikado | 331/20 X |
| 4,131,861 | 12/1978 | Malaviya | 331/2 |
| 4,380,742 | 4/1983 | Hart | 331/1 A |
| 4,543,661 | 9/1985 | Defeuilly et al. | 331/1 A X |

Primary Examiner—Siegfried H. Grimm
Attorney, Agent, or Firm—Vincent B. Ingrassia

[57] ABSTRACT

A frequency controlled oscillator arranged to be fabricated in integrated circuit form including a primary frequency controlled oscillator and a secondary frequency controlled oscillator with a counter arranged to periodically count pulses of the oscillation frequency of the secondary frequency controlled oscillator and to produce a first output signal if the count is less than a predetermined value and to produce a second output signal if the count is greater than a predetermined value, and control means providing a bias control signal in dependence on the output signals of the counter for tuning the oscillation frequency of both the secondary frequency controlled oscillator and the primary frequency controlled oscillator.

7 Claims, 2 Drawing Figures

4,654,604

FREQUENCY CONTROLLED OSCILLATOR UTILIZING AN U/D COUNTER IN THE FEEDBACK

This invention relates to frequency controlled oscillators and particularly, though not exclusively, to voltage controlled oscillators (VCO's). The invention finds particular application to VCO's fabricated in integrated circuit form.

In a VCO an oscillator circuit is provided whose oscillation frequency is dependent on an applied voltage. In order to tune the VCO accurately to a particular desired frequency and in order to maintain this desired frequency in operation of the circuit, reference is conventionally made to a reference frequency external to the circuit (e.g. derived from an external crystal).

However, where a VCO is to be made in an integrated circuit, the use of such a reference external to the integrated circuit requires the use of one pin of the integrated circuit. It will, of course, be understood that in integrated circuits the number of pins available is strictly limited and so the use of one pin for an external reference frequency to tune an on-chip VCO may necessitate compromises in input/output functions and circuit design elsewhere in the integrated circuit.

It is an object of the present invention to provide a frequency controlled oscillator suitable for fabrication in integrated circuit form wherein the above disadvantage may be overcome or at least alleviated.

In accordance with a first aspect of the present invention a frequency controlled oscillator arrangement for fabriction in integrated circuit form comprises:

at least one primary frequency controlled oscillator; and a secondary frequency controlled oscillator comprising:

a frequency controllable oscillator circuit;

A reference frequency source; counter means arranged periodically to count pulses of the reference frequency source to produce a first output signal if the count is less than a predetermined value and to produce a second output signal if the count is greater than a predetermined value; and control means for providing a bias control signal in dependence on the output signals of the counter means for tuning the oscillation frequency of both the secondary frequency controlled oscillator and the or each primary frequency controlled oscillator.

In a particular embodiment of the invention the control means comprises: an up/down counter arranged to be decremented by the first output signal of the counter means and arranged to be incremented by the second output signal of the counter means; and digital to analogue converter means for generating the control signal representative of the count of the up/down counter.

Preferably the predetermined value is changeable between a plurality of predetermined values.

In accordance with a second aspect of the present invention, a frequency controlled oscillator arrangement for fabrication in integrated circuit form comprises:

A reference frequency source;

a frequency controllable oscillator circuit;

counter means arranged to sample the output of the frequency controllable oscillator circuit in a first mode when the output is not required and to periodically count pulses of the reference frequency source and to produce a first output signal if the count is less than a predetermined value and a second output signal if the count is greater than the predetermined value; and control means for producing a bias control signal in dependence on the output signals of the counter means for tuning the oscillation frequency of the frequency controlled oscillator.

It will be appreciated that such a frequency controlled oscillator in accordance with the second aspect of the invention is particularly suited to applications where the oscillator is required to produce its output to drive additional circuitry only periodically, e.g. as a VCO in generating timebase signals in a television receiver.

Two voltage controlled oscillators in accordance with the invention will now be described, by way of example only, with reference to the accompanying drawings, in which.

Figure 1:
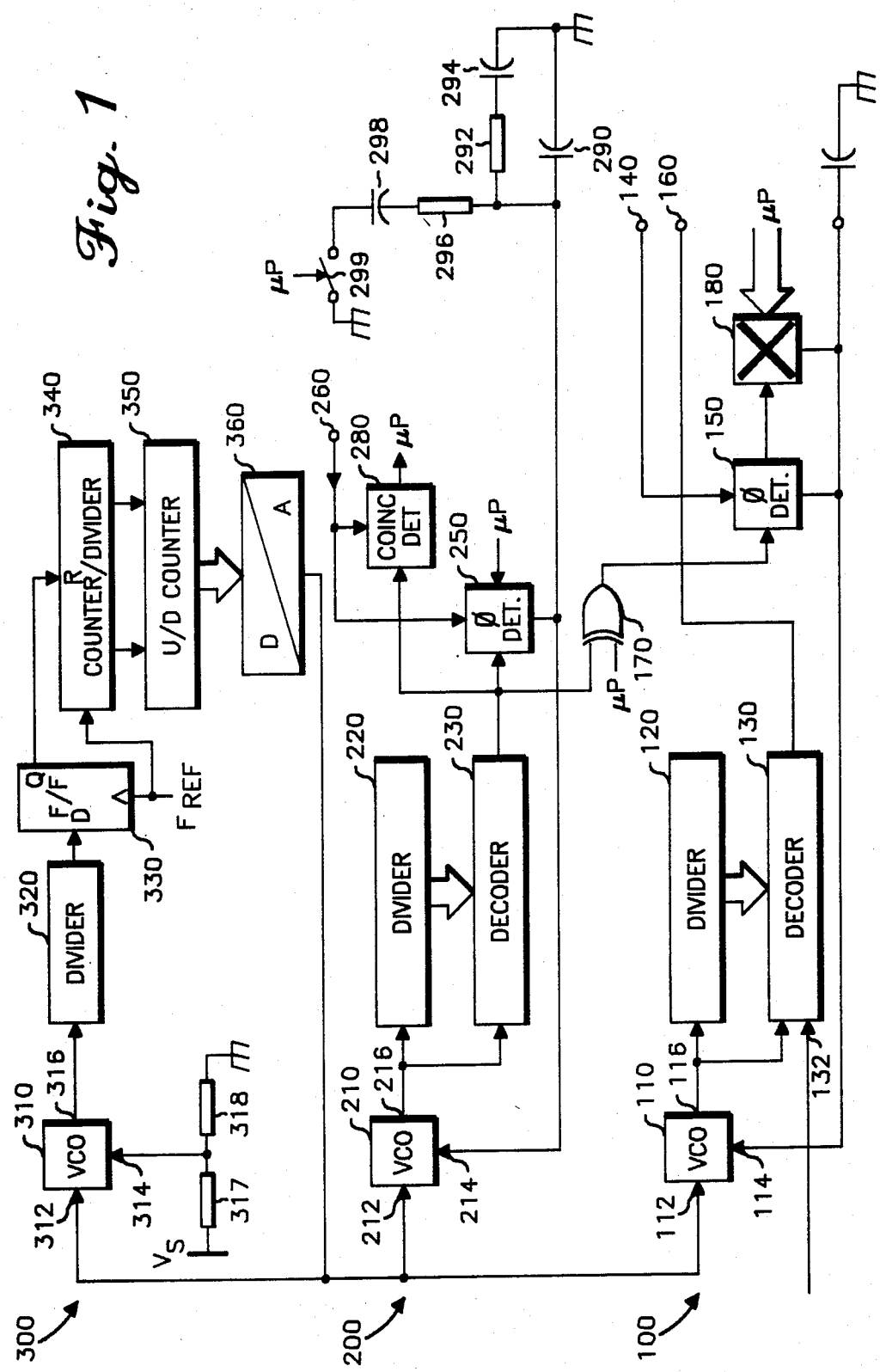
FIG. 1 shows a block-schematic diagram of a first voltage controlled oscillator system.

Referring firstly to FIG. 1, the horizontal time base section of an integrated circuit for use in a television receiver includes primary oscillators 100 and 200 and a secondary oscillator 300.

The oscillator 100 includes a voltage controllable oscillator circuit 110 having control inputs 112 and 114 and an output 116. The output 116 is connected to the input of a divider 120 and to the input of a decoder 130. The decoder 130 is connected to receive in parallel from the divider 120 a six-bit word and to produce an output signal at node 160 when an output enable signal is applied at an input 132 of the decoder 130. The VCO 100 also includes a phase detector 150 having a first input connected to the node 140 and a second input connected to the output of an exclusive OR gate 170. The output of the phase detector 150 is connected directly to the input 114 of the voltage controllable oscillator circuit 110 and is also connected to one input of a multiplier 180.

The oscillator 200 includes a voltage controllable oscillator circuit 210 having control inputs 212 and 214 and an output 216. The output 216 is connected to the input of a divider 220 and to the input of a decoder 230. The decoder 230 is connected to receive in parallel from the divider 220 a six-bit work and to produce an output signal. The osillator 200 also includes a phase detector 250 having a first input connected to the output of the node 260 and a second input connected to the output of the decoder 230. The output of the phase detector 250 is connected directly to the input 214 of the voltage controllable oscillator circuit 210. The oscillator 200 also includes a coincidence detector 280 having a first input connected to the node 260 and a second input connected to the output of the decoder 230. The output of the coincidence detector 280 is connected to a controlling mircoprocessor (not shown). The output of the decoder 230 is also connected to one input of the exclusive OR gate 170, the other input of the gate being supplied by the controlling microporcessor (not shown). The output of the phase detector 250 is also connected to ground via a capacitor 290, to ground via a resistor 292 and a capacitor 294 and to ground via a resistor 296, a capacitor 298 and a switch 299 controlled by the microprocessor (not shown).

The oscillator 300 includes a voltage controllable oscillator circuit 310 having control inputs 312 and 314 and an ouptut 316. The control input 314 is connected to a potential divider constituted by resistors 317, 318 and supplied by a supply voltage $V_S$. The output 316 is connected to the input of a divider 320 whose output is connected to the signal input of a D-type flip-flop 330. The output of the flip-flop is connected to the reset of a counter/divider arrangement 340. A clock input of counter/divider 340 is connected to an on-chip reference source (not shown) constructed to provide a reference frequency $F_{ref}$ which is also applied to the clock input of the flip-flop 330. The counter/divider arrangement 340 has two outputs which are connected to an up/down counter 350. The count of the counter 350 is applied as a parallel six-bit word to a digital to analog (D/A) converter 360. The output of the D/A converter is applied to the input 312 of the voltage controllable oscillator circuit 310 and also, as will be explained hereafter, to the inputs 212 and 112 of the voltage controllable oscillator circuits 210 and 110 respectively.

In use of the circuit a flyback signal is applied to node 140 and a horizontal sync signal is applied to node 260. The voltage controllable oscillator circuits 210 and 110 each produce nominal output frequencies of 1 MHz, and the dividers 220 and 120 are each arranged to divide by 64. It will be understood that the signal derived at the output of the decoder 230 is the horizontal frequency signal. Coincidence of this signal with the horizontal sync pulse applied at node 260 is detected in the coincidence detector 280 and signalled to the microprocessor. The phase detector 250 compares the phase of the horizontal sync pulse applied to node 260 with the derived horizontal frequency from the decoder 230 and applies an appropriate control signal to the input 214 of the voltage controllable oscillator circuit 210. The phase detector 250 also receives additional inputs from the microprocessor in order to control its gain and vertical inhibit.

The horizontal frequency signal derived from the decoder 230 is applied to one input of the exclusive OR gate 170, the other input of the gate being provided from the microprocessor. The output of the exclusive OR gate 170, which is a 180 degree phase shifted version of the horizontal frequency signal derived at the output of of the decoder 230, is applied to the phase detector 150. The phase detector 150 compares the phase of the applied phase shifted horizontal frequency signal with the phase of the flyback signal applied at node 140 and produces an appropriate control voltage which is applied to the input 114 of the voltage controllable oscillator circuit 110. It will be understood that, when enabled at its input 132, the decoder 130 produces a horizontal drive signal which appears at node 160.

It will be appreciated that for optimum operation with a video cassette recorder, the circuit sensitivity needs to be changed. This is effected by the microprocessor closing the switch 299, so bringing into circuit the resistor 296 and the capacitor 298.

The voltage controllable oscillator 310 produces an output signal having a frequency, like the voltage controllable oscillators 210 and 110, of 1 Hz. The divider 320 divides this frequency down by 16 and this divided frequency is used by the flip-flop 330 to reset the counter/divider 340. The on chip reference frequency used to clock the counter/divider 340 is conveniently 4.4 MHz divided by 4, i.e. 1.1 MHz. After each reset the counter/divider 340 begins to count and if at the next reset a predetermined count value has been exceeded an output signal on the up output is generated. Conversely if at the next reset the predetermined count value has not been reached than a down output signal is generated on the down output. Thus at each reset of the counter/divider 340 the up/down counter 350 either (1) counts up if an up output signal was produced by the counter/divider 340, or (2) counts down if a down output signal was produced by the counter/divider 340 or (3) retains its count at the same value if no output signal was produced by the counter/divider 340. The count value of the up/down counter 350 is converted by the digital-to-analog converter 360 to a bias voltage which is applied to the input 312 of the voltage controllable oscillator 310 to tune its output to the desired frequency. The same bias control voltage is applied to the inputs 212 and 112 of the voltage controllable oscillators 210 and 110 to also tune their outputs to the desired frequency.

Thus it will be appreciated that the primary oscillator 200 and 100 used to produce the horizontal drive signal at the node 160 are both tuned by providing the secondary oscillator 300 to generate the bias control voltage. It will be appreciated that the bias control voltage is generated on-chip without using an external reference frequency and so obviates the use of a pin of the integrated circuit. In practice, the oscillator arrangement described enables the oscillators to maintain a free-running frequency accurate to ±3% with on-chip RC time constants accurate to ±30%.

It will be appreciated that in order to be able to change the oscillator frequencies between those required in the horizontal timebases of the different television systems, the predetermined value held by the counter/divider to determine whether it produces up or down signals is changeable (under mircoprocessor control) between different predetermined values.

Figure 2:
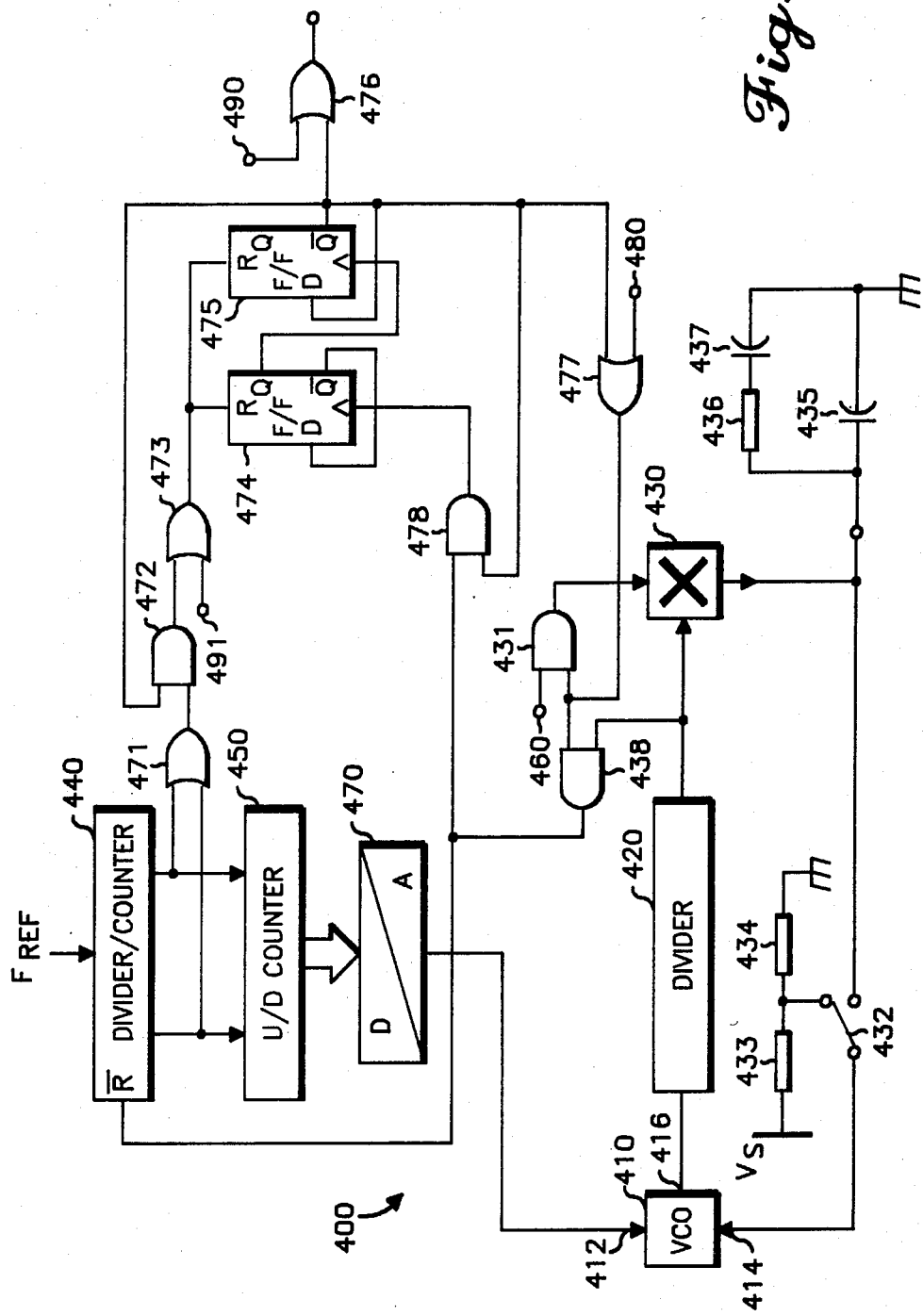
FIG. 2 shows a block-schematic diagram of a second voltage controlled oscillator.

Referring not to FIG. 2, the horizontal timebase section of a second integrated circuit for use in a television receiver includes a single voltage controlled oscillator 400. The VCO 400 includes a voltage controllable oscillator circuit 410 having inputs 412 and 414 and an output 416. The output 416 is connected to the input of a divider 420 whose output is connected to one input of a multiplier 430. Another input of the multiplier is connected to the output of an AND gate 431, one of whose inputs is connected to a node 460. The output of the multiplier 430 is applied via a switch 432 to the input 414 of the voltage controllable oscillator circuit 410. The switch 432 switches the connection of the input 414 between the output of the multiplier 430 and a supply voltage $V_s$ through a voltage divider 433, 434. The output of the multiplier 430 is also connected to ground via a capacitor 435 and also to ground via a resistor 436 and a capacitor 437.

The output of divider 420 is also connected to one input of an AND gate 438 whose output is connected to the input of a divider/counter 440. The divider/counter 440 is clocked by an on-chip reference frequency $F_{REF}$ as in the previously described timebase circuit of FIG. 1. The divider/counter 440 has two outputs which are connected to an up/down counter 450. The count of the up/down counter 450 is connected as a parallel six-bit word to the input of a digital-to-analog converter 470. The output of the digital-to-analog converter 470 is connected to the input 412 of the voltage controllable oscillator circuit 410.

The two outputs of the divider/counter 440 are also connected to the two inputs of an OR gate 471 whose output is connected to one input of an AND gate 472. The output of AND gate 472 is connected to one input of an OR gate 473 whose output is connected to the reset inputs of two flip-flops 474, 475. The non-inverted output of flip-flop 474 is connected to the input of flip-flop 475 and the inverted output of flip-flop 475 is connected to one input of an OR gate 476. The inverted output of flip-flop 475 is also connected to an input of AND gate 472 and also to one input of an OR gate 477. The inverted output of flip-flop 475 is also connected to one input of an AND gate 478 whose output is connected to the input of flip-flop 474. Another input of AND gate 478 is connected to the output of AND gate 438. The output of OR gate 477 is connected to an input of AND gate 438 and also to an input of AND gate 431. An input of OR gate 477 is connected to node 480. An input of OR gate 476 is connected to node 490.

In use the timebase circuit of FIG. 2 operates similarly to the timebase circuit of FIG. 1 and will only be described hereafter in so far as to explain its differences in operation.

A horizontal sync signal is applied at node 460 and with the input 414 connected to the capacitor 435, the VCO loop 410, 420, 430 operates to generate the horizontal frequency, at the output of the divider 420, as in the previously described timebase generator of FIG. 1. With the switch 432 in this position tuning of the VCO is performed wholly by the VCO loop 410, 420, 430.

However, in those parts of the picture frame where the horizontal timebase signal is not used a frame signal which is applied to node 480 causes the AND gate 438 to be enabled and so causes the counter 440 to count. The counter/divider 440 produces up and down outputs which drive the up/down counter 450, and the digital-to-analog converter 470 produces a bias control voltage which is applied to input 412 to tune the oscillation frequency of the voltage controllable oscillator circuit 410, similarly to the timebase generator of FIG. 1. When the frame signal applied at node 480 disables the AND gate 438 the counter 440 is prevented from counting. At the same time the switch 432 connects the input 414 to the capacitor 435 and the VCO loop 410, 420, 430 generates the horizontal frequency as described above. The horizontal frequency signal may be disabled by an inhibit signal applied at node 490.

In order to allow the frequency of the VCO to be tuned to its desired value when the circuit is powered up, a power-on-reset signal applied to OR gate 473 via node 491 causes the circuit to be held in "tuning" mode until the counter/divider 440 has ceased to produce "up" or "down" signals for a predetermined number of cycles.

It will be appreciated that in the timebase generator of FIG. 2 the free running frequency of the voltage controllable oscillator circuit 410 is tuned without having recourse to an external reference frequency, as in the timebase generator of FIG. 1, but in the generator of FIG. 2 no extra "secondary" VCO is used, the VCO being tuned when its generated frequency is not required for driving additional circuitry.

We claim:

1. A frequency controlled oscillator arrangement for fabriction in integrated circuit form comprising:
    at least one primary frequency controlled oscillator; and
    a secondary frequency controlled oscillator comprising:
    a frequency controllable oscillator circuit;
    a reference frequency source;
    counter means arranged periodically to count pulses of the reference frequency source and to produce a first output signal if the count is less than a predetermined value and to produce a second output signal if the count is greater than the predetermined value; and
    control means for providing a bias control signal in dependence on the output signals of the counter means for tuning the oscillation frequency of both the secondary frequency controlled oscillator and the primary frequency controlled oscillator.

2. A frequency controlled oscillator arrangement for fabrication in integrated circuit form comprising:
    a frequency controllable oscillator circuit having first and second modes;
    a reference frequency source;
    counter means arranged to sample the output of the frequency controllable oscillator circuit in the first mode when the output is not required and to periodically count pulses of the reference frequency source and to produce a first output signal if the count is less than a predetermined value and a second output signal if the count is greater than the predetermined value;
    control means for producing a bias control signal in dependence on the output signals of the counter means for tuning the oscillation frequency of the frequency controllable oscillator circuit; and
    multiplier means connected in a closed loop with said frequency controllable oscillator in the second mode, said multiplier means having an input connected to receive a second reference frequency from a source other than said reference frequency source and to lock said frequency controllable oscillator onto said second reference frequency.

3. A frequency controlled oscillator arrangement according to claim 1 or 2 wherein the control means comprises:
    an up/down counter arranged to be decremented by the first output signal of the counter means and arranged to be incremented by the second output signal of the counter means; and digital to analogue converter means for generating the control signal representative of the count of the up/down counter for tuning the oscillation frequency of the frequency controllable oscillator.

4. A frequency controlled oscillator arrangement according to claim 1 or 2 wherein the counter means is arranged to count pulses of a reference frequency and to be periodically reset.

5. A frequency controlled oscillator arrangement according to claim 2 further comprising power-on reset means for maintaining the arrangement in the first mode when the counter means has failed to produce output signals for a predetermined time.

6. A frequency controlled oscillator arrangement according to claim 1 or 2 wherein the predetermined value is changeable between a plurality of predetermined values so as to tune the oscillator arrangement between a plurality of predetermined frequencies.

7. A frequency controlled oscillator arrangement accordin to claim 1 or 2 wherein the frequency controlled oscillators are voltage controlled oscillators and the bias control signal is a voltage signal.

* * * * *